(12) United States Patent
Jee

(10) Patent No.: US 8,987,582 B2
(45) Date of Patent: Mar. 24, 2015

(54) SOLAR CELL APPARATUS

(75) Inventor: Suk Jae Jee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 272 days.

(21) Appl. No.: 13/381,272

(22) PCT Filed: Jun. 30, 2010

(86) PCT No.: PCT/KR2010/004224
§ 371 (c)(1),
(2), (4) Date: Dec. 28, 2011

(87) PCT Pub. No.: WO2011/002210
PCT Pub. Date: Jan. 6, 2011

(65) Prior Publication Data
US 2012/0103390 A1    May 3, 2012

(30) Foreign Application Priority Data

Jun. 30, 2009    (KR) ................. 10-2009-0058898
Jun. 30, 2009    (KR) ................. 10-2009-0059521

(51) Int. Cl.
*H01L 31/042*    (2014.01)
*H02N 6/00*    (2006.01)
*H01L 31/0749*    (2012.01)
*H01L 27/142*    (2014.01)
*H01L 31/02*    (2006.01)
*H01L 31/0224*    (2006.01)

(52) U.S. Cl.
CPC ........ *H01L 31/0749* (2013.01); *H01L 27/1426* (2013.01); *H01L 31/0201* (2013.01); *H01L 31/022425* (2013.01); *Y02E 10/541* (2013.01)
USPC ........................................ 136/244

(58) Field of Classification Search
CPC ............ H01L 27/1422; H01L 27/1423; H01L 27/1425; H01L 27/1426; H01L 27/1427; H01L 31/0201; H01L 31/022416
USPC .................................................. 136/244, 256
See application file for complete search history.

(56) References Cited

U.S. PATENT DOCUMENTS

| 4,461,922 A * | 7/1984 | Gay et al. ................. 136/249 |
| 5,176,758 A * | 1/1993 | Nath et al. ................ 136/251 |
| 5,421,908 A * | 6/1995 | Yoshida et al. ........... 136/244 |
| 5,457,057 A * | 10/1995 | Nath et al. ................. 438/67 |
| 6,187,150 B1 * | 2/2001 | Yoshimi et al. ....... 204/192.29 |
| 7,235,736 B1 * | 6/2007 | Buller et al. ............. 136/251 |
| 2002/0029798 A1 * | 3/2002 | Miyoshi ..................... 136/244 |
| 2006/0185714 A1 | 8/2006 | Nam et al. |

(Continued)

FOREIGN PATENT DOCUMENTS

| JP | 49-011086 | 1/1974 |
| JP | 62-111480 A | 5/1987 |

(Continued)

OTHER PUBLICATIONS

Office Action dated Oct. 18, 2011 in Korean Application No. 10-2009-0058898, filed Jun. 30, 2009.

(Continued)

*Primary Examiner* — Eli Mekhlin
(74) *Attorney, Agent, or Firm* — Saliwanchik, Lloyd & Eisenschenk

(57) ABSTRACT

Provided is a solar cell apparatus. The solar cell apparatus includes a substrate, a first cell disposed on the substrate, and a second cell disposed on the substrate around the first cell.

14 Claims, 7 Drawing Sheets

(56) References Cited

U.S. PATENT DOCUMENTS

| | | | |
|---|---|---|---|
| 2006/0283498 A1* | 12/2006 | Gronet | 136/256 |
| 2007/0062576 A1* | 3/2007 | Duerr et al. | 136/263 |
| 2007/0202797 A1 | 8/2007 | Ishibashi | |
| 2009/0014064 A1 | 1/2009 | Shinohara | |
| 2010/0018564 A1 | 1/2010 | Shinohara | |
| 2010/0018565 A1 | 1/2010 | Funakoshi | |

FOREIGN PATENT DOCUMENTS

| | | | |
|---|---|---|---|
| JP | 62111480 A * | 5/1987 | |
| JP | H01-121958 | 8/1989 | |
| JP | H02-040967 A | 2/1990 | |
| JP | H03-165579 A | 7/1991 | |
| JP | H11-026786 A | 1/1999 | |
| JP | 2000-258244 A | 9/2000 | |
| JP | 2003-273384 A | 9/2003 | |
| JP | 2007-012545 A | 1/2007 | |
| JP | 2007-073933 A | 3/2007 | |
| JP | 2007-273491 A | 10/2007 | |
| JP | 2008-252051 A | 10/2008 | |
| JP | 2008-294080 A | 12/2008 | |
| JP | 2009-076512 A | 4/2009 | |
| KR | 10-2006-0090455 A | 8/2006 | |
| KR | 10-2009-0005983 A | 1/2009 | |
| KR | 10-2009-0013721 A | 2/2009 | |
| KR | 10-2009-0043600 A | 5/2009 | |
| WO | WO-2008-090718 A1 | 7/2008 | |

OTHER PUBLICATIONS

Decision of Grant dated Nov. 30, 2011 in Korean Application No. 10-2009-0059521, filed Jun. 30, 2009.
International Search Report in International Application No. PCT/KR2010/004224, filed Jun. 30, 2010.
Notice of Allowance dated Jul. 31, 2012 in Korean Application No. 10-2009-0058898, filed Jun. 30, 2009.
Office Action dated Feb. 12, 2014 in Japanese Application No. 2012-518492.

* cited by examiner

SOLAR CELL APPARATUS

CROSS-REFERENCE TO RELATED APPLICATIONS

This application is the U.S. national stage application of International Patent Application No. PCT/KR2010/004224, filed Jun. 30, 2010, which claims priority to Korean Application Nos. 10-2009-0059521, filed Jun. 30, 2009, and 10-2009-0058898, filed Jun. 30, 2009, the disclosures of each of which are incorporated herein by reference in their entirety.

TECHNICAL FIELD

The present disclosure relates to a solar cell apparatus.

BACKGROUND ART

Recent increasing consumption of energy has facilitated development of solar cells capable of converting solar energy into electric energy.

Particularly, CuInGaSe (CIGS) solar cells are common, which are PN hetero junction devices having a substrate structure constituted by a glass substrate, a metal back electrode layer, a p-type CIGS light absorption layer, a high resistance buffer layer, and an n-type window layer.

Much research is now being conducted to improve the performance of such solar cells.

DISCLOSURE OF THE INVENTION

Technical Problem

Embodiments provide a solar cell apparatus having improved photoelectric conversion efficiency by reducing deviations of cells and positional deviations of each cell, improving electric characteristics of the cells, and increasing the area of an active region.

Technical Solution

In one embodiment, a solar cell apparatus includes: a substrate; a first cell disposed on the substrate; and a second cell disposed on the substrate around the first cell.

In another embodiment, a solar cell apparatus including: a substrate; a first cell disposed on the substrate; and a second cell disposed on the substrate around the first cell.

Advantageous Effects

As described above, in the solar cell apparatus according to the embodiments, the second cell surrounds the first cell. That is, in the solar cell apparatus according to the embodiments, the cells sequentially surround the center of the substrate when viewed from the top.

Therefore, electrons activated by sunlight can move from the center region to the outer region of the solar cell apparatus or from the outer region to the center region of the solar cell apparatus. That is, since electrons move from the center region to the outer region of the solar cell apparatus, the electrons can move along a shorter passage as compared with the case where electrons move from an end to the other end of a solar cell apparatus.

Therefore, according to the embodiments, loss such as resistance loss can be reduced in the solar cell apparatus. As a result, the solar cell apparatus can generate electricity more efficiently.

In addition, the thicknesses of the layers of the solar cell apparatus may be varied due to process condition differences such as a process temperature difference between the center and outer regions of the substrate. For example, the thicknesses of the layers may be reduced from the center region to the outer region of the solar cell apparatus. That is, the characteristics of the layers of the solar cell apparatus may be varied from the center region to the outer region of the solar cell apparatus.

However, in the solar cell apparatus of the embodiments, the cells sequentially surround the center of the substrate. Therefore, the characteristics of each cell can be uniform. That is, since each cell can extend on the substrate with a constant distance from the center of the substrate, characteristics such as the thickness of each cell may not be varied according to positions.

In addition, characteristic differences such as thickness differences among the cells can be compensated for by adjusting the areas of the cells. That is, an outer cell having a relatively low output power per unit area may have a relatively large area, and an inner cell having a relatively high output power per unit area may have a relatively small area.

In this way, characteristic differences among the cells can be compensated for. Since variations of characteristics of the cells can be reduced as described above, the total output power of the solar cell apparatus can be stable.

In addition, the solar cell apparatus can have a circular plate shape. Therefore, the area of an inactive region of the solar cell apparatus can be reduced through an edge deletion process.

That is, the solar cell apparatus of the embodiments can have a smaller inactive region than a solar cell apparatus having a rectangular shape.

Thus, photoelectric conversion efficiency of the solar cell apparatus of the embodiments can be improved.

MODE FOR CARRYING OUT THE INVENTION

Figure 1:
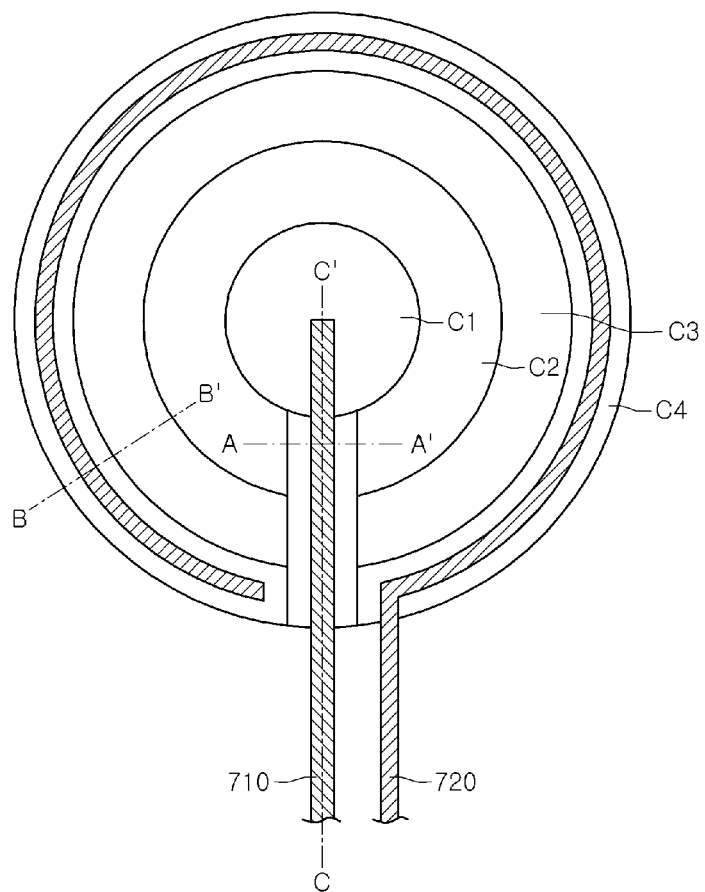
FIG. 1 is a plan view illustrating a solar cell apparatus according to a first embodiment.

In the descriptions of embodiments, it will be understood that when a substrate, a layer, a film, or an electrode is referred to as being 'on/under' another substrate, layer, film, sheet, layer, film, or electrode, it can be directly on the other substrate, layer, film, or electrode, or one or more intervening substrates, layers, films, or electrodes may also be present.

Further, the reference about 'on' and 'under' each element will be made on the basis of drawings. Also, in the drawings, the sizes of elements may be exaggerated for clarity of illustration, and the size of each element does not entirely reflect an actual size.

Figure 2:
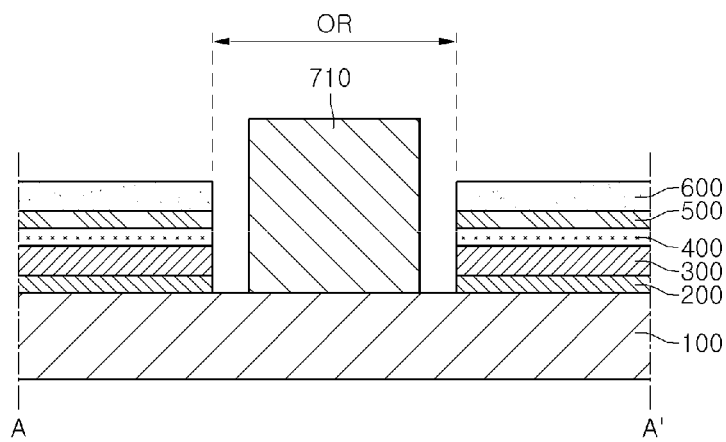
FIG. 2 is a sectional view taken along line A-A' of FIG. 1.
Figure 3:
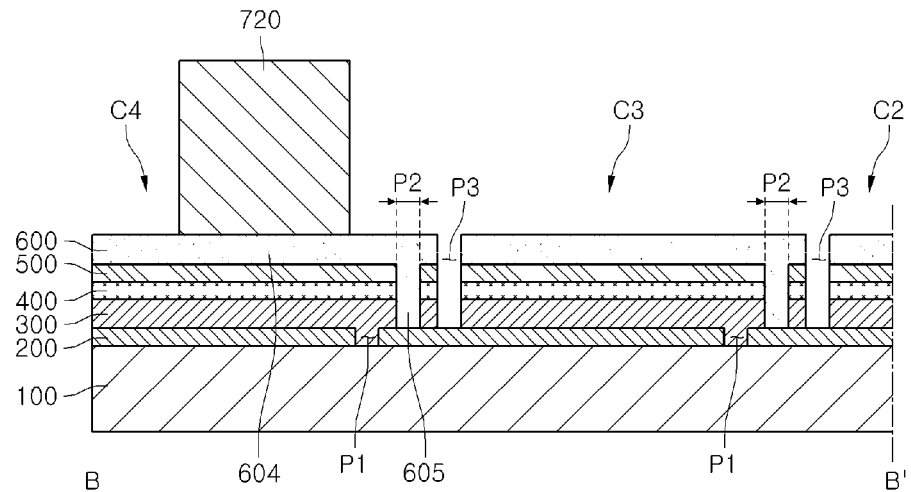
FIG. 3 is a sectional view taken along line B-B' FIG. 1.
Figure 4:
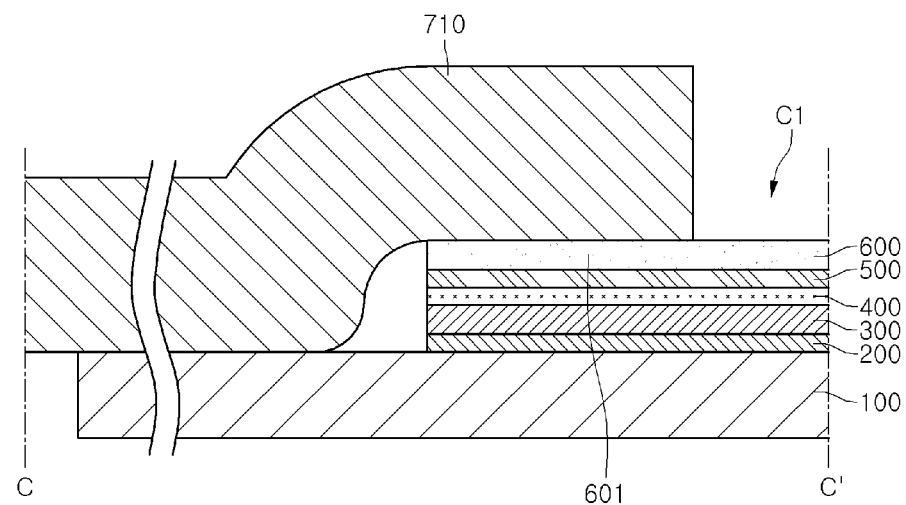
FIG. 4 is a sectional view taken along line C-C' of FIG. 1.

FIG. 1 is a plan view illustrating a solar cell apparatus according to a first embodiment. FIG. 2 is a sectional view taken along line A-A' of FIG. 1. FIG. 3 is a sectional view taken along line B-B' FIG. 1. FIG. 4 is a sectional view taken along line C-C' of FIG. 1.

Referring to FIGS. 1 to 4, the solar cell apparatus of the first embodiment includes a support substrate 100, a plurality of cells (C1, C2, . . . ), a first bus bar 710, and a second bus bar 720.

The support substrate 100 supports the cells (C1, C2, . . . ), the first bus bar 710, and the second bus bar 720. The support substrate 100 has a plate shape. In detail, the support substrate 100 may have a circular or elliptical plate shape.

The support substrate 100 may be a glass, plastic, or metal substrate. In more detail, the support substrate 100 may be a soda lime glass substrate.

The cells (C1, C2, . . . ) are disposed on the support substrate 100. One of the cells (C1, C2, . . . ) is disposed in a center region of the support substrate 100 when viewed from the top. The others of the cells (C1, C2, . . . ) sequentially surround the center cell C1.

The cells (C1, C2, . . . ) may be a first cell C1, a second cell C2, a third cell C3, and a fourth cell C4.

The first cell C1 is disposed in the center region of the support substrate 100. In more detail, the first cell C1 is disposed at a position corresponding to the center of the support substrate 100. The first cell C1 may be disposed on the support substrate 100 like an island. In addition, the first cell C1 may have a circular or elliptical shape.

The second cell C2 surrounds the first cell C1. The second cell C2 is disposed on the support substrate 100 around the first cell C1. That is, the second cell C2 is disposed at the outside of the first cell C1. When viewed from the top, the second cell C2 has a partially opened ring shape.

The second cell C2 may extend along the outside of the first cell C1. In detail, the second cell C2 may extend along the outside of the first cell C1 in a manner such that the distance from the center of the support substrate 100 to the second cell C2 is constant.

The third cell C3 surrounds the second cell C2. That is, the third cell C3 is disposed on the support substrate 100 around the second cell C2. The third cell C3 is disposed at the outside of the second cell C2. When viewed from the top, the third cell C3 has a partially opened ring shape.

The third cell C3 may extend along the outside of the second cell C2. In detail, the third cell C3 may extend along the outside of the second cell C2 in a manner such that the distance from the center of the support substrate 100 to the third cell C3 is constant.

The fourth cell C4 surrounds the third cell C3. That is, the fourth cell C4 is disposed on the support substrate 100 around the third cell C3. The fourth cell C4 is disposed at the outside of the third cell C3. The fourth cell C4 is the outermost cell. That is, the fourth cell C4 is disposed on the outside of the support substrate 100.

When viewed from the top, the fourth cell C4 has an opened ring shape. The fourth cell C4 extends along the outside of the third cell C3. In detail, the fourth cell C4 may extend along the outside of the third cell C3 in a manner such that the distance from the center of the support substrate 100 to the fourth cell C4 is constant.

In this way, the first to fourth cells C1 to C4 are sequentially arranged from the center to the outside of the support substrate 100. The second to fourth cells C2 to C4 sequentially surround the first cell C1. Neighboring cells of the first to fourth cells C1 to C4 are connected in series.

The areas of the cells (C1, C2, . . . ) may correspond to each other. That is, the areas of the cells (C1, C2, . . . ) may be substantially equal. Alternatively, the area of an outer cell of the cells (C1, C2, . . . ) may be greater than the area or an inner cell of the cells (C1, C2, . . . ).

For example, the areas of the first to fourth cells C1 to C4 may be equal or may increase in the order of C1, C2, C3, and C4.

In FIG. 1, the first to fourth cells C1 to C4 are illustrated. However, more cells (C1, C2, . . . ) may be disposed on the support substrate 100.

Each of the cells (C1, C2, . . . ) includes a back electrode, a light absorption part, a buffer, a high resistance buffer, and a window that are sequentially stacked on the support substrate 100.

As shown in FIGS. 1 and 2, the second to fourth cells C2 to C4 include an open region OR through which the top surface of the support substrate 100 is exposed. The open region OR may be formed by partially removing the second to fourth cells C2 to C4.

The width of the open region OR is greater than the width of the first bus bar 710. The open region OR extends from the first cell C1 to the outer edge of the support substrate 100.

Referring to FIGS. 1, 2, and 4, the first bus bar 710 is disposed on the support substrate 100. The first bus bar 710 is disposed in the open region OR. The first bus bar 710 extends from the first cell C1 to the outside of the support substrate 100.

The first bus bar 710 is connected to the first cell C1. In detail, the first bus bar 710 is connected to a window 601 of the first cell C1. In more detail, the first bus bar 710 makes direct contact with a window 601 of the first cell C1.

The second bus bar 720 is disposed on the support substrate 100. The second bus bar 720 is connected to the fourth cell C4. In detail, the second bus bar 720 is connected to a window 604 of the fourth cell C4. In more detail, the second bus bar 720 makes direct contact with the window 604 of the fourth cell C4.

That is, the second bus bar 720 is connected to the outermost cell. The second bus bar 720 extends along the outer edge of the support substrate 100. That is, the second bus bar 720 corresponds to the outer edge of the support substrate 100.

The second bus bar 720 surrounds the first to third cells C1 to C3. That is, the second bus bar 720 extends along the outside of the third cell C3.

The first and second bus bars 710 and 720 may be formed of a material such as copper or silver.

As shown in FIGS. 2 to 4, the solar cell apparatus of the embodiment has a multilayer structure constituted by a plurality of layers 200 to 600. In detail, the solar cell apparatus of the embodiment includes a back electrode layer 200, a light absorption layer 300, a buffer layer 400, a high resistance buffer layer 500, a window layer 600, and connection electrodes 605.

The back electrode layer 200 is disposed on the support substrate 100. The back electrode layer 200 is a conductive layer formed of a material such as molybdenum (Mo).

The back electrode layer 200 includes a plurality of first grooves P1. The back electrode layer 200 is divided into a plurality of back electrodes 200 by the first grooves P1. The back electrodes 200 constitute the cells (C1, C2, . . . ).

The first grooves P1 extend around the center of the support substrate 100. The first grooves P1 surround the center of the support substrate 100 in a manner such that the first grooves P1 are spaced apart from the center of the support substrate 100 at predetermined intervals. In detail, each of the first grooves P1 extend around the center of the support substrate 100 with a constant distance from the center of the support substrate 100.

For example, the number of the first grooves P1 may be three, and distances from the first grooves P1 to the center of the support substrate 100 are different.

That is, one of the first grooves P1 is closest to the center of the support substrate 100 and extends around the center of the support substrate 100. Another of the first grooves P1 extends around the closest one of the first grooves P1.

The light absorption layer 300 is disposed on the back electrode layer 200. The light absorption layer 300 may be a CuInGaSe (CIGS) light absorption layer.

The buffer layer 400 is disposed on the light absorption layer 300. For example, the buffer layer 400 may be formed of cadmium sulfide.

The high resistance buffer layer 500 is disposed on the buffer layer 400. For example, the high resistance buffer layer 500 may be formed of a non-doped zinc oxide.

Second grooves P2 are formed in the light absorption layer 300, buffer layer 400, and the high resistance buffer layer 500. The second grooves P2 are close to the first grooves P1, respectively. Similarly, the second grooves P2 extend around the center of the support substrate 100.

For example, the number of the second grooves P2 may be three, and distances from the second grooves P2 to the center of the support substrate 100 are different.

The light absorption layer 300, the buffer layer 400, and the high resistance buffer layer 500 are divided into a plurality of light absorption parts, a plurality of buffers, and a plurality of high resistance buffers by the second grooves P2.

The window layer 600 is disposed on the high resistance buffer layer 500. For example, the window layer 600 may be formed of an aluminum-doped zinc oxide.

Third grooves P3 are formed in the window layer 600 and are close to the first grooves P1. The window layer 600 is divided into a plurality of windows by the third grooves P3.

Similarly, the second grooves P2 extend around the center of the support substrate 100.

For example, the number of the third grooves P3 may be three, and distances from the third grooves P3 to the center of the support substrate 100 are different.

The connection electrodes 605 connect the window layer 600 and the back electrode layer 200. In detail, the connection electrodes 605 extend from the window layer 600 to the back electrode layer 200.

The connection electrodes 605 are disposed in the second grooves P2. The connection electrodes 605 form closed loops.

The cells (C1, C2, . . . ) are separated by the first grooves P1, the second grooves P2, and the third grooves P3.

In the solar cell apparatus of the embodiment, a charge may move from a center region to an outer region or from the outer region to the center region. That is, a current generated by sunlight may flow from the first cell C1 to the fourth cell C4 or from the fourth cell C4 to the first cell C1.

That is, since a current flows between the center and outer regions of the solar cell apparatus, a passage for electrons is short. In other words, electrons can move along a relatively short passage in the solar cell apparatus of the embodiment as compared with other solar cell apparatuses in which electrons move from one end to the other end.

Since electrons can move along a short passage in the solar cell apparatus of the embodiment, loss such as resistance loss can be reduced. Thus, the solar cell apparatus of the embodiment can generate electricity more efficiently.

Due to process condition variations such as a process temperature difference between the center and outer regions of the support substrate 100, the thicknesses of the back electrode layer 200, the light absorption layer 300, the buffer layer 400, the high resistance buffer layer 500, and the window layer 600 may be varied.

For example, the thicknesses of the layers 200 to 600 may be reduced from the center region to the outer region of the support substrate 100. That is, characteristics of the layers 200 to 600 may be varied according to the distance from the center of the support substrate 100.

However, since the cells (C1, C2, . . . ) are sequentially disposed around the support substrate 100, the characteristics of each of the cells (C1, C2, . . . ) may be uniform. For example, the first cell C1 may be formed under approximately constant conditions according to positions. In addition, the second cell C2 may be formed under approximately constant conditions according to positions.

That is, each of the cells (C1, C2, . . . ) may have an approximately uniform thickness according to positions.

In addition, differences of characteristics of the cells (C1, C2, . . . ) caused by thickness differences of the cells (C1, C2, . . . ) may be compensated for by areas of the cells (C1, C2, . . . ). For example, the first cell C1 may have a high output power per unit area, and the fourth cell C4 may have a relatively low output power per unit area.

In this case, it may be set such that the first cell C1 has a relatively small area and the fourth cell C4 has a relatively large area. In this way, the output powers of the first cell C1 and the fourth cell C4 may be set to equal.

That is, output power differences among the cells (C1, C2, . . . ) can be compensated for. Since variations of characteristics of the cells (C1, C2, . . . ) can be reduced in this way, the total output power of the solar cell apparatus of the embodiment can be stable.

The solar cell apparatus can have a circular plate shape. Therefore, the area of an inactive region of the solar cell apparatus can be reduced through an edge deletion process.

Thus, photoelectric conversion efficiency of the solar cell apparatus of the embodiment can be improved.

Figure 5:
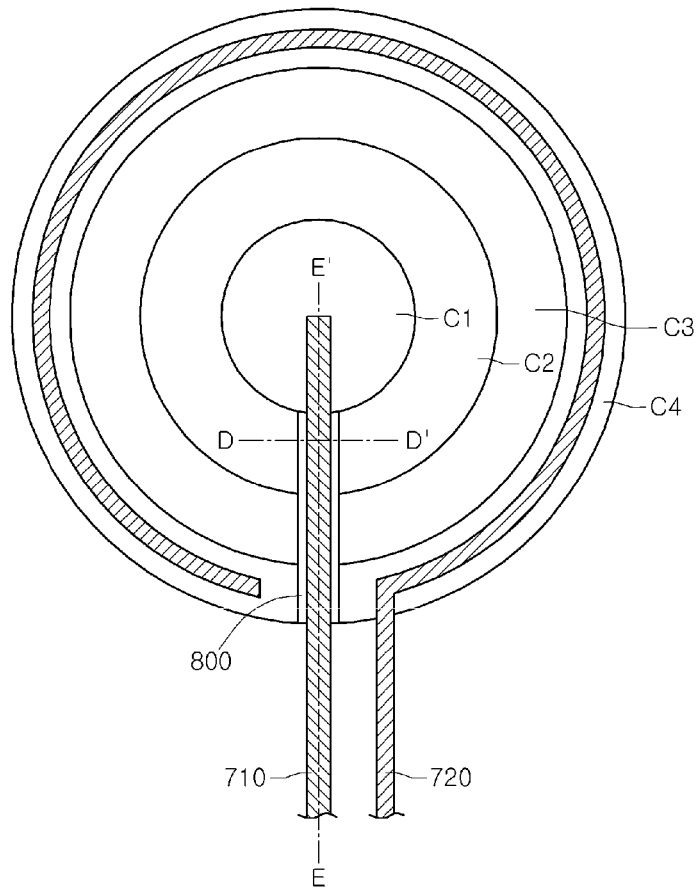
FIG. 5 is a plan view illustrating a solar cell apparatus according to a second embodiment.
Figure 6:
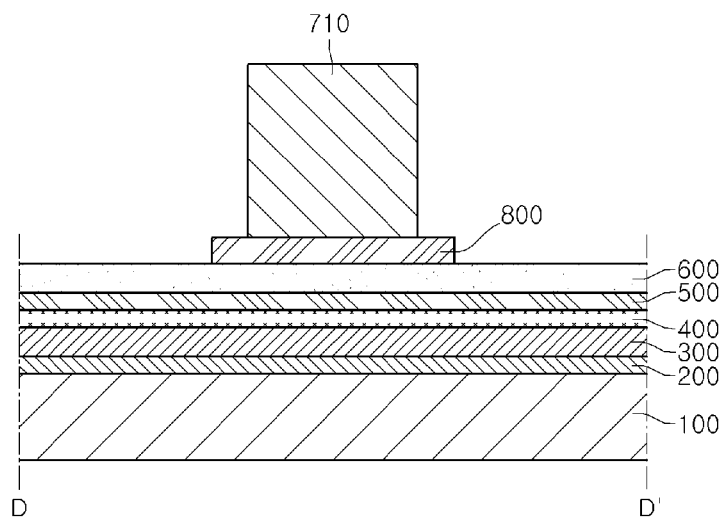
FIG. 6 is a sectional view taken along line D-D' of FIG. 5.
Figure 7:
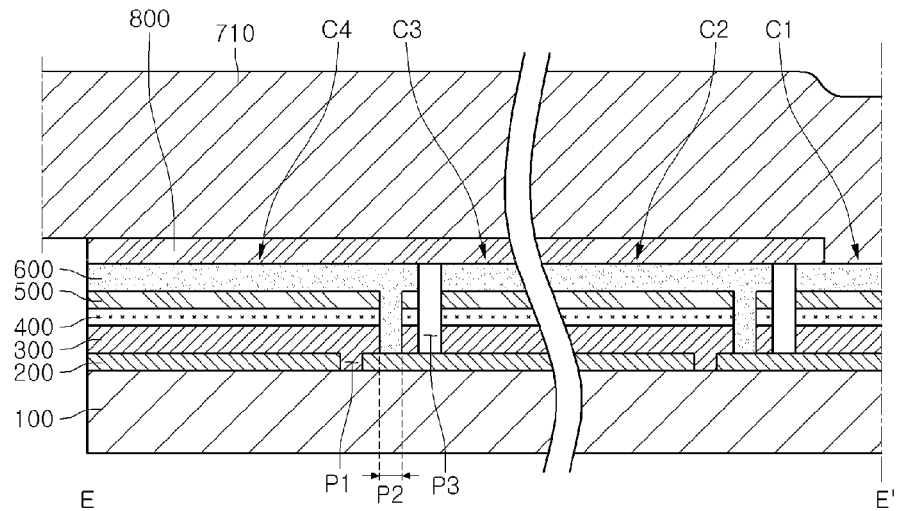
FIG. 7 is a sectional view taken along line E-E' of FIG. 5.

FIG. 5 is a plan view illustrating a solar cell apparatus according to a second embodiment. FIG. 6 is a sectional view taken along line D-D' of FIG. 5. FIG. 7 is a sectional view taken along line E-E' of FIG. 5. In the following description of the current embodiment, an insulation member will be additionally described with reference to the above description of the first embodiment. The above description of the first embodiment may be incorporated in the following description of the current embodiment except for modified parts.

Referring to FIGS. 5 to 7, second to fourth cells C2 to C4 do not include an open region.

Therefore, the second to fourth cells C2 to C4 have ring shapes when viewed from the top. That is, the second to fourth cells C2 to C4 have closed loop shapes.

In detail, the second cell C2 entirely surrounds a first cell C1, and the third cell C3 entirely surrounds the second cell C2. The fourth cell C4 entirely surrounds the third cell C3.

An insulation member 800 is disposed between a first bus bar 710 and the first to fourth cells C1 to C4. The insulation member 800 has a shape corresponding to the shape of the first bus bar 710. The insulation member 800 extends outward from the first cell C1.

The insulation member 800 insulates the first bus bar 710 from the second to fourth cells C2 to C4. For example, the insulation member 800 may be formed of a polymer resin. For example, an insulation tape may be used as the insulation member 800.

The solar cell apparatus of the current embodiment does not include an open region formed by partially removing the cells (C1, C2, . . . ). Instead, the solar cell apparatus includes the insulation member 800, and thus the solar cell apparatus may have a larger active region used for converting sunlight into electricity.

In the case of a solar cell apparatus including an open region, it may be necessary to sufficiently widen the open region for spacing a first bus bar from cells. That is, a sufficient space is necessary for preventing a short circuit between a first bus bar and cells.

However, since the cells (C1, C2, . . . ) are vertically spaced from the first bus bar 710 owing to the insulation member 800, the active area of the solar cell apparatus of the current embodiment is not reduced.

Therefore, the solar cell apparatus of the current embodiment can have improved photoelectric conversion efficiency.

Figure 8:
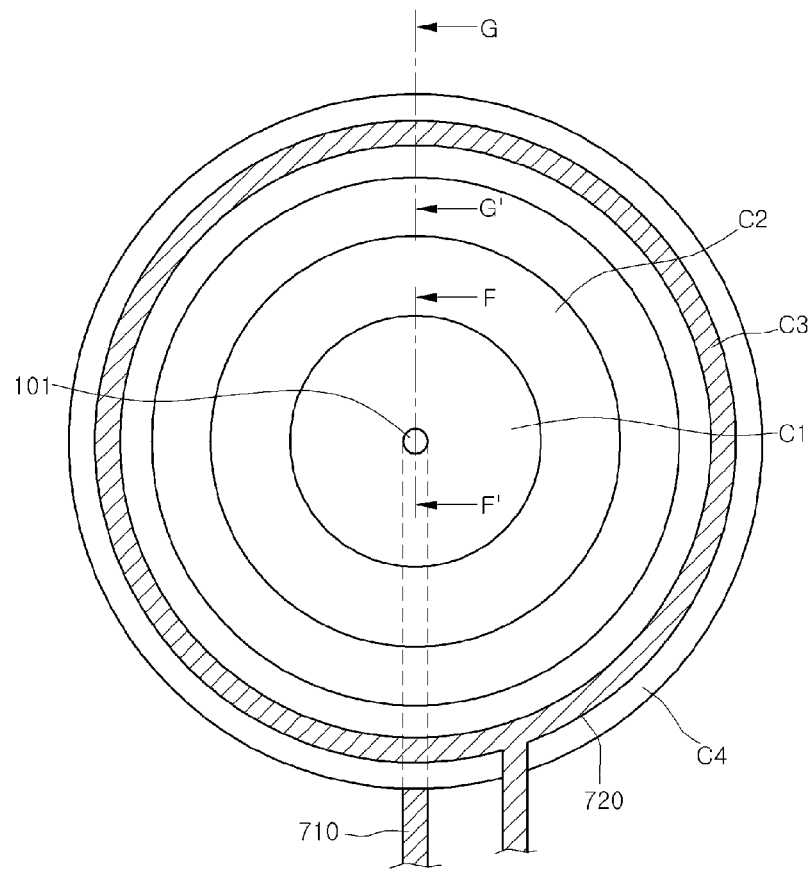
FIG. 8 is a plan view illustrating a solar cell apparatus according to a third embodiment.
Figure 9:
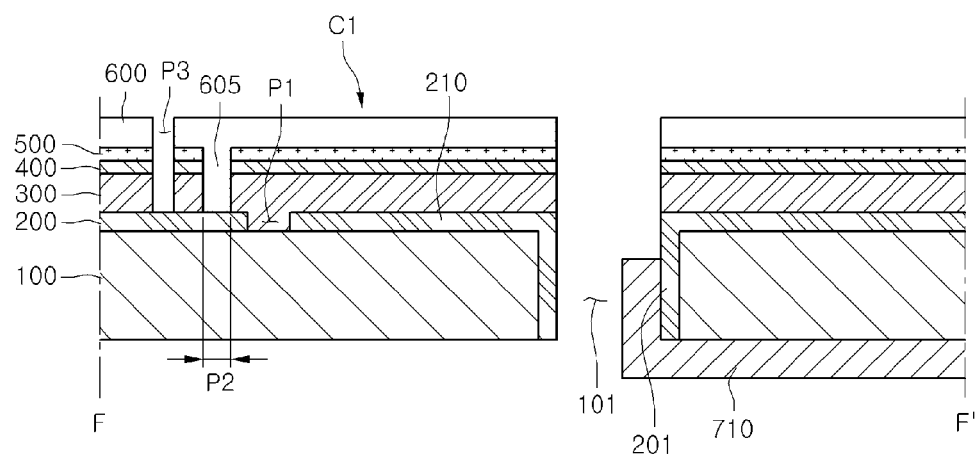
FIG. 9 is a sectional view taken along line F-F' of FIG. 8.
Figure 10:
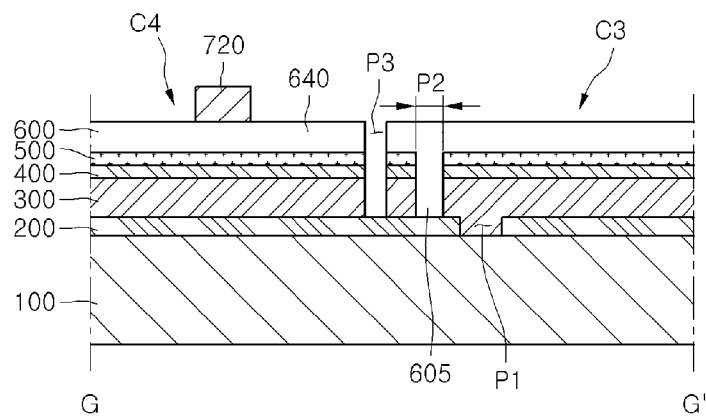
FIG. 10 is a sectional view taken along line G-G' of FIG. 8.

FIG. 8 is a plan view illustrating a solar cell apparatus according to a third embodiment. FIG. 9 is a sectional view taken along line F-F' of FIG. 8. FIG. 10 is a sectional view taken along line G-G' of FIG. 8. The third embodiment will now be explained with reference to the descriptions of the previous embodiments. The descriptions of the previous embodiments may be incorporated in the following description of the third embodiment except for modified parts.

Referring to FIGS. 8 to 10, the solar cell apparatus of the third embodiment includes a support substrate 100, a plurality of cells (C1, C2, . . . ), a first bus bar 710, and a second bus bar 720.

The support substrate 100 supports the cells (C1, C2, . . . ), the first bus bar 710, and the second bus bar 720. The support substrate 100 has a plate shape. In detail, the support substrate 100 may have a circular or elliptical plate shape.

The support substrate 100 may be a glass, plastic, or metal substrate. In more detail, the support substrate 100 may be a soda lime glass substrate.

A penetration hole is formed in the support substrate 100. The penetration hole 101 is formed through the support substrate 100. The penetration hole 101 is formed in a center region of the support substrate 100. In detail, the penetration hole 101 may be formed through the center of the support substrate 100.

The cells (C1, C2, . . . ) are disposed on the support substrate 100. When viewed from the top, the cells (C1, C2, . . . ) surround the penetration hole 101. In detail, the cells (C1, C2, . . . ) sequentially surround the penetration hole 101.

The cells (C1, C2, . . . ) may be a first cell C1, a second cell C2, a third cell C3, and a fourth cell C4.

The third cell C1 surrounds the penetration hole 101. The first cell C1 is disposed on the support substrate 100 around the penetration hole 101. The first cell C1 is disposed in the center region of the support substrate 100.

In addition, the first cell C1 may have a circular or elliptical shape.

The second cell C2 surrounds the first cell C1. The second cell C2 is disposed on the support substrate 100 around the first cell C1. That is, the second cell C2 is disposed at the outside of the first cell C1. When viewed from the top, the second cell C2 has a ring shape. The second cell C2 has a closed loop shape.

The third cell C3 surrounds the second cell C2. That is, the third cell C3 is disposed on the support substrate 100 around the second cell C2. That is, the third cell C3 is disposed at the outside of the second cell C2. When viewed from the top, the third cell C3 has a ring shape. The third cell C3 has a closed loop shape.

The fourth cell C4 surrounds the third cell C3. That is, the fourth cell C4 is disposed on the support substrate 100 around the third cell C3. The fourth cell C4 is disposed at the outside of the third cell C3. The fourth cell C4 is the outermost cell. That is, the fourth cell C4 is disposed on the outside of the support substrate 100.

When viewed from the top, the fourth cell C4 has a ring shape. The fourth cell C4 has a closed loop shape.

In this way, the first to fourth cells C1 to C4 are sequentially arranged from the center to the outside of the support substrate 100 to sequentially surround the penetration hole 101. Neighboring cells of the first to fourth cells C1 to C4 are connected in series.

The areas of the cells (C1, C2, . . . ) may correspond to each other. That is, the areas of the cells (C1, C2, . . . ) may be substantially equal. Alternatively, the area of an outer cell of the cells (C1, C2, . . . ) may be greater than the area or an inner cell of the cells (C1, C2, . . . ).

For example, the areas of the first to fourth cells C1 to C4 may be equal or may increase in the order of C1, C2, C3, and C4.

In FIG. 8, the first to fourth cells C1 to C4 are illustrated. However, more cells (C1, C2, . . . ) may be disposed on the support substrate 100.

Each of the cells (C1, C2, . . . ) includes a back electrode, a light absorption part, a buffer, a high resistance buffer, and a window that are sequentially stacked on the support substrate 100.

The first bus bar 710 is disposed under the support substrate 100. The first bus bar 710 is connected to the first cell C1. In detail, the first bus bar 710 is connected to a back electrode 210 of the first cell C1.

The first bus bar 710 is connected to the first cell C1 through a connection electrode 201 disposed on an inner surface of the penetration hole 101.

The connection electrode 201 extends from the back electrode 210 of the first cell C1. The connection electrode 201 and the back electrode 210 of the first cell C1 are formed in one piece. The connection electrode 201 may be disposed on the entire inner surface of the penetration hole 101.

A portion of the first bus bar 710 is disposed in the penetration hole 101 and makes direct contact with the connection electrode 201. The first bus bar 710 extends from the penetration hole 101 to the outside of the support substrate 100.

The second bus bar 720 is disposed on the support substrate 100. The second bus bar 720 is connected to the fourth cell C4. In detail, the second bus bar 720 is connected to a window 640 of the fourth cell C4. In more detail, the second bus bar 720 makes direct contact with the window 640 of the fourth cell C4.

That is, the second bus bar 720 is connected to the outermost cell C4. The second bus bar 720 extends along the outer edge of the support substrate 100. That is, the second bus bar 720 corresponds to the outer edge of the support substrate 100.

The second bus bar 720 has a closed loop shape. That is, the second bus bar 720 has a ring shape.

The first and second bus bars 710 and 720 may be formed of a material such as copper or silver.

As shown in FIGS. 9 to 10, the solar cell apparatus of the third embodiment has a multilayer structure constituted by a plurality of layers 200 to 600. In detail, the solar cell apparatus of the third embodiment includes a back electrode layer 200, a light absorption layer 300, a buffer layer 400, a high resistance buffer layer 500, a window layer 600, and connection electrodes 605.

The back electrode layer 200 is disposed on the support substrate 100. The back electrode layer 200 is a conductive layer formed of a material such as molybdenum (Mo).

The back electrode layer 200 includes a plurality of first grooves P1. The back electrode layer 200 is divided into a plurality of back electrodes 200 by the first grooves P1. The back electrodes 200 constitute the cells (C1, C2, . . . ).

The first grooves P1 extend around the penetration hole 101. The first grooves P1 surround the penetration hole 101 in a manner such that the first grooves P1 are spaced apart from the penetration hole 101 at predetermined intervals. In detail, each of the first grooves P1 extend around the penetration hole 101 with a constant distance from the penetration hole 101.

When viewed from the top, the first grooves P1 have a ring shape. When viewed from the top, the first cell C1 has a ring shape.

For example, the number of the first grooves P1 may be three, and distances from the first grooves P1 to the penetration hole 101 are different.

One of the first grooves P1 is closest to the penetration hole 101. Another of the first grooves P1 extends around the first groove P1 closest to the penetration hole 101.

The light absorption layer 300 is disposed on the back electrode layer 200. The light absorption layer 300 may be a CIGS light absorption layer.

The buffer layer 400 is disposed on the light absorption layer 300. For example, the buffer layer 400 may be formed of cadmium sulfide.

The high resistance buffer layer 500 is disposed on the buffer layer 400. For example, the high resistance buffer layer 500 may be formed of a non-doped zinc oxide.

Second grooves P2 are formed in the light absorption layer 300, buffer layer 400, and the high resistance buffer layer 500. The second grooves P2 are close to the first grooves P1, respectively. Similarly, the second grooves P2 extend around the penetration hole 101.

When viewed from the top, the second grooves P2 have a ring shape, that is, a closed loop shape.

For example, the number of the second grooves P2 may be three, and distances from the second grooves P2 to the penetration hole 101 are different.

The light absorption layer 300, the buffer layer 400, and the high resistance buffer layer 500 are divided into a plurality of light absorption parts, a plurality of buffers, and a plurality of high resistance buffers by the second grooves P2.

The window layer 600 is disposed on the high resistance buffer layer 500. For example, the window layer 600 may be formed of an aluminum-doped zinc oxide.

Third grooves P3 are formed in the window layer 600 and are close to the first grooves P1. The window layer 600 is divided into a plurality of windows by the third grooves P3.

When viewed from the top, the third grooves P3 have a ring shape, that is, a closed loop shape. For example, the number of the third grooves P3 may be three, and distances from the third grooves P3 to the penetration hole 101 are different.

The connection electrodes 605 connect the window layer 600 and the back electrode layer 200. In detail, the connection electrodes 605 extend from the window layer 600 to the back electrode layer 200.

The connection electrodes 605 are disposed in the second grooves P2. The connection electrodes 605 form closed loops.

The cells (C1, C2, . . . ) are separated by the first grooves P1, the second grooves P2, and the third grooves P3.

The connection electrode 201 is connected to the back electrode layer 200. In detail, the connection electrode 201 extends from the back electrode layer 200.

The first bus bar 710 is connected to the back electrode layer 200 through the connection electrode 201.

The second bus bar 720 is disposed on the window layer 600. That is, the second bus bar 720 is directly connected to the window layer 600.

In the solar cell apparatus of the current embodiment, a charge may move from a center region to an outer region or from the outer region to the center region. That is, a current generated by sunlight may flow from the first cell C1 to the fourth cell C4 or from the fourth cell C4 to the first cell C1.

That is, since a current flows between the center and outer regions of the solar cell apparatus, a passage for electrons is short. In other words, electrons can move along a relatively short passage in the solar cell apparatus of the current embodiment as compared with other solar cell apparatuses in which electrons move from one end to the other end.

Since electrons can move along a short passage in the solar cell apparatus of the current embodiment, loss such as resistance loss can be reduced. Thus, the solar cell apparatus of the current embodiment can generate electricity more efficiently.

In addition, since the penetration hole 101 is formed in the center region of the support substrate 100, heat can be dissipated through the penetration hole 101 when the back electrode layer 200, the light absorption layer 300, the buffer layer 400, the high resistance buffer layer 500, and the window layer 600 are formed.

Therefore, when the solar cell apparatus of the current embodiment is manufactured, process temperature variations can be reduced.

Due to process condition variations such as a process temperature difference between the center and outer regions of the support substrate 100, the thicknesses of the back electrode layer 200, the light absorption layer 300, the buffer layer 400, the high resistance buffer layer 500, and the window layer 600 may be varied.

For example, the thicknesses of the layers 200 to 600 may be reduced from the center region to the outer region of the support substrate 100. That is, characteristics of the layers 200 to 600 may be varied as it goes away from the penetration hole 101 increases.

However, since the cells (C1, C2, . . . ) are sequentially disposed around the penetration hole 101, the characteristics of each of the cells (C1, C2, . . . ) may be uniform. For example, the first cell C1 may be formed under approximately constant conditions according to positions. In addition, the second cell C2 may be formed under approximately constant conditions according to positions.

That is, each of the cells (C1, C2, . . . ) may have an approximately uniform thickness according to positions.

In addition, differences of characteristics of the cells (C1, C2, . . . ) caused by thickness differences of the cells (C1, C2, . . . ) may be compensated for by areas of the cells (C1, C2, . . . ). For example, the first cell C1 may have a high output power per unit area, and the fourth cell C4 may have a relatively low output power per unit area.

In this case, it may be set such that the first cell C1 has a relatively small area and the fourth cell C4 has a relatively large area. In this way, the output powers of the first cell C1 and the fourth cell C4 may be set to equal.

That is, output power differences among the cells (C1, C2, . . . ) can be compensated for. Since variations of characteristics of the cells (C1, C2, . . . ) can be reduced in this way, the total output power of the solar cell apparatus of the current embodiment can be stable.

The solar cell apparatus can have a circular plate shape. Therefore, the area of an inactive region of the solar cell apparatus can be reduced through an edge deletion process.

Thus, photoelectric conversion efficiency of the solar cell apparatus of the current embodiment can be improved.

Figure 11:
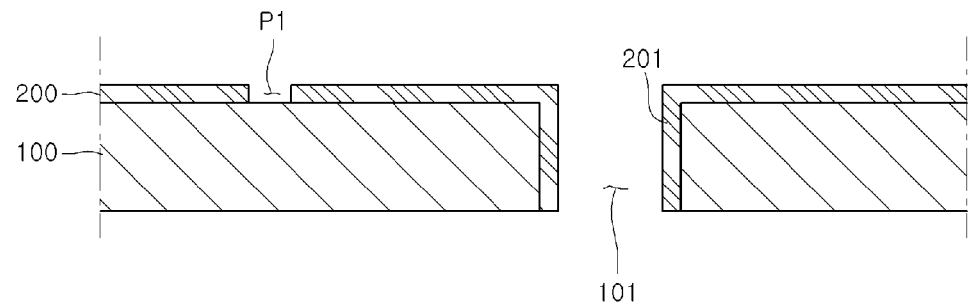
FIGS. 11 to 13 are views for explaining a method of manufacturing the solar cell apparatus of the third embodiment.
Figure 12:
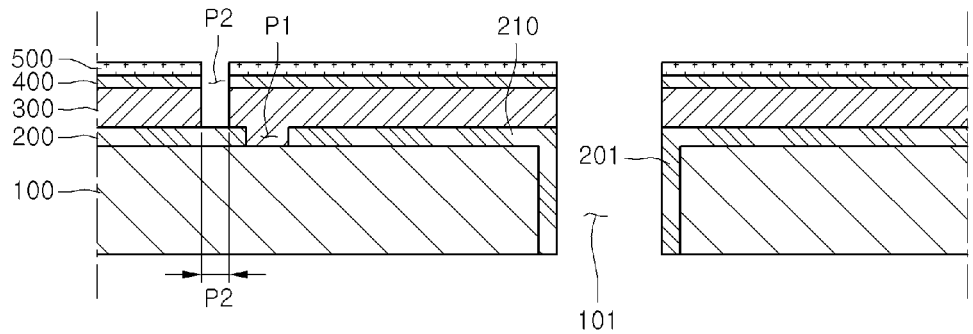
Figure 13:
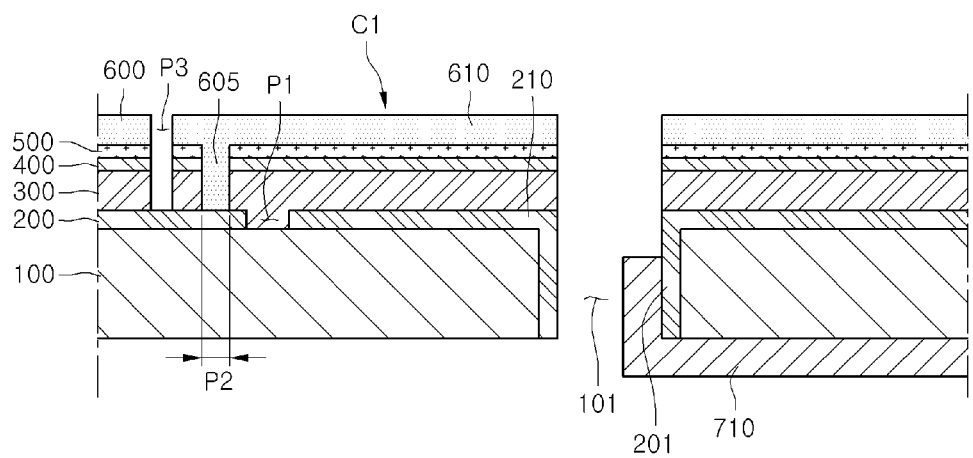

FIGS. 11 to 13 are views for explaining a method of manufacturing the solar cell apparatus of the third embodiment. The method will now be explained with reference to the descriptions of the previous embodiments. That is, the descriptions of the previous embodiments may be incorporated in the following description of the method except for different parts.

Referring to FIG. 11, a back electrode layer 200 and a connection electrode 201 are formed on a support substrate 100 in which a penetration hole 101 is formed.

The back electrode layer 200 and the connection electrode 201 are formed by depositing molybdenum through a sputtering or evaporation process.

In this case, molybdenum is deposited on the inner surface of the penetration hole 101. That is, the connection electrode 201 is formed by molybdenum deposited on the inner surface of the penetration hole 101. The connection electrode 201 may be deposited on the entire inner surface of the penetration hole 101.

Owing to the penetration hole 101, a temperature difference between center and outer regions of the support substrate 100 may be decreased.

Although the temperature difference is decreased, the thickness of the back electrode layer 200 may be varied according to positions. For example, the back electrode layer 200 may be relatively thick in the center region of the support substrate 100 and relatively thin in the outer region of the support substrate 100.

Thereafter, first grooves P1 are formed in the back electrode layer 200. The first grooves P1 may be formed using a laser. The top surface of the support substrate 100 is exposed through the first grooves P1.

The first grooves P1 extend around the penetration hole 101. The first grooves P1 have a closed loop shape. For example, the first grooves P1 may extend along concentric circles having different diameters.

Next, referring to FIG. 12, a light absorption layer 300, a buffer layer 400, and a high resistance buffer layer 500 are sequentially formed on the back electrode layer 200.

For example, copper, indium, gallium, and selenium may be simultaneously or separately evaporated to form an Cu—In—Ga-selenide based (Cu(In,Ga)Se2; CIGS based) light absorption layer as the light absorption layer 300, or a metal precursor film forming process and a selenization process may be sequentially performed to form the light absorption layer 300 and 300.

In the latter case, a metal precursor film is formed on the back electrode layer 200 through a sputtering process using a copper target, an indium target, and a gallium target.

Then, a layer of copper-indium-gallium-selenide (Cu(In, Ga)Se2; CIGS) is formed as the light absorption layer 300 by selenizing the metal precursor film.

Alternatively, such sputtering process using a copper target, an indium target, and a gallium target may be simultaneously with such as a selenization process.

Alternatively, a sputtering process using a copper target and an indium target or using a copper target and a gallium target, and a selenization process may be performed to form the light absorption layer 300 as a CIS based absorption layer or a CGS based light absorption layer.

Thereafter, the buffer layer 400 is deposited on the light absorption layer 300 by depositing cadmium sulfide (CdS) on the light absorption layer 300 by a chemical bath deposition (CBD) method.

Next, the high resistance buffer layer 500 is formed on the buffer layer 400 by depositing a non-doped zinc oxide on the buffer layer 400 through a vacuum deposition process.

Next, second grooves P2 are formed at positions close to the first grooves P1. The second grooves P2 may extend along the first grooves P1. When viewed from the top, the second grooves P2 may have a shape similar to that of the first grooves P1.

In addition, a CIGS based compound, cadmium sulfide (CdS), and a zinc oxide may be deposited on the connection electrode 201, and a process of removing the deposited materials may be further carried out.

Referring to FIG. 13, an aluminum-doped zinc oxide is deposited on the high resistance buffer layer 400 to form a window layer 600. The window layer 600 is formed by a vacuum deposition process such as a sputtering process or an evaporation process. At this time, connection electrodes 605 are formed in the second grooves P2.

At this time, an aluminum-doped zinc oxide may be deposited on the connection electrode 201, and a process of removing the aluminum-doped zinc oxide may be further performed.

Third grooves P3 are formed in the window layer 600 at positions close to the second grooves P2. Similarly, the third grooves P3 may extend along the second grooves P2. When viewed from the top, the third grooves P3 may have a shape similar to that of the second grooves P2.

The back electrode layer 200, the light absorption layer 300, the buffer layer 400, the high resistance buffer layer 500, and the window layer 600 are divided into a plurality of cells (C1, C2, . . . ) by the first grooves P1, the second grooves P2, and the third grooves P3.

Thereafter, a first bus bar 710 is formed under the support substrate 100 in a manner such that the first bus bar 710 is connected to the connection electrode 201, and a second bus bar 720 is formed on an outermost cell C4 so that the second bus bar 720 can be connected to the outermost cell C4.

In this way, the solar cell apparatus having a circular plate shape and improved power generating efficiency can be manufactured.

Figure 14:
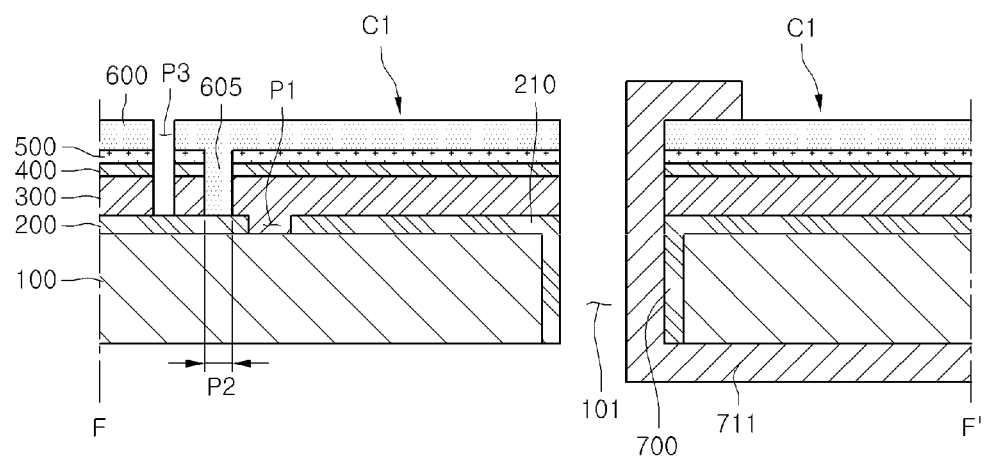
FIG. 14 is a sectional view illustrating a solar cell apparatus according to a fourth embodiment.

FIG. 14 is a sectional view illustrating a solar cell apparatus according to a fourth embodiment. In the following description of the current embodiment, a bus bar will be additionally described with reference to the descriptions of the previous embodiments. The descriptions of the previous embodiments may be incorporated in the following description of the third embodiment except for modified parts.

Referring to FIG. 14, the solar cell apparatus of the current embodiment does not include the connection electrode 201 of the solar cell apparatus of the third embodiment.

In addition, a first bus bar 711 is directly connected to a window layer 600 through a penetration hole 101. That is, the first bus bar 711 is disposed on the window layer 600, the inner surface of the penetration hole 101, and the bottom surface of a support substrate 100.

The first bus bar 711 is connected to a window of a first cell C1.

Since the first bus bar 711 is directly connected to the window layer 600, the contact area between the first bus bar 711 and the first cell C1 may be large. For example, the first bus bar 711 may make contact with the entire top surface of the window 610 of the first cell C1.

Therefore, in the solar cell apparatus of the current embodiment, the contact resistance between the first bus bar 711 and the first cell C1 can be reduced.

Therefore, the solar cell apparatus of the current embodiment can have improved photoelectric conversion efficiency.

Figure 15:
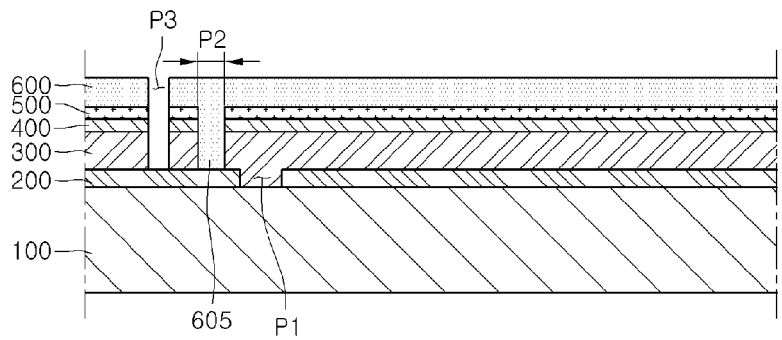
FIGS. 15 to 17 are views for explaining a method of manufacturing the solar cell apparatus of the fourth embodiment.
Figure 16:
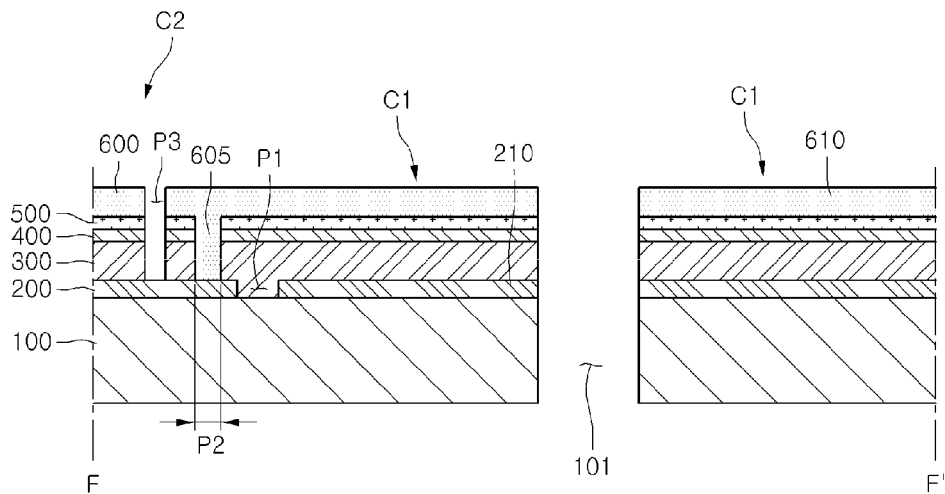
Figure 17:
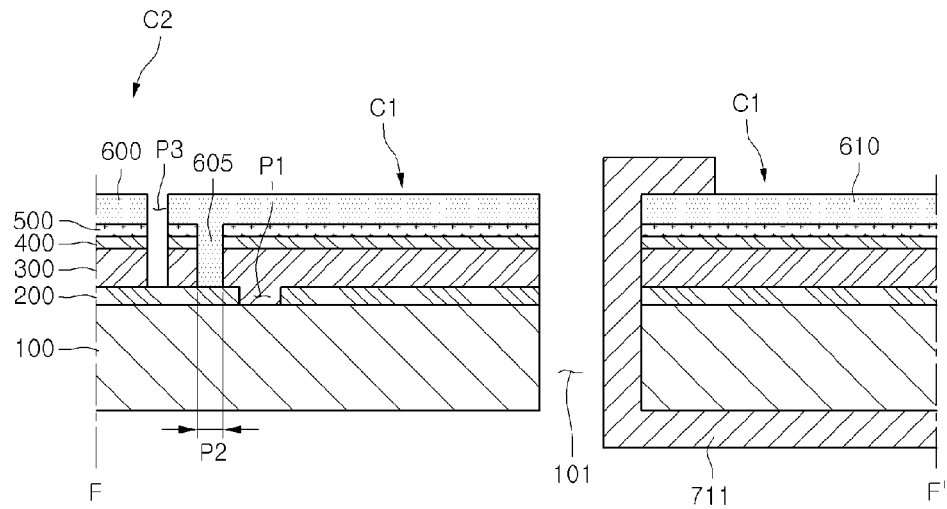

FIGS. 15 to 17 are views for explaining a method of manufacturing a solar cell apparatus according to another embodiment. The current embodiment will now be described with reference to the descriptions of the previous embodiments. The descriptions of the previous embodiments may be incorporated in the following description of the current embodiment except for modified parts.

Referring to FIG. 15, a back electrode layer 200, a light absorption layer 300, a buffer layer 400, a high resistance buffer layer 500, and a window layer 600 are sequentially formed on a circular support substrate 100 in which a penetration hole is not formed.

Referring to FIG. 16, a penetration hole 101 is formed through the support substrate 100, the back electrode layer 200, the light absorption layer 300, the buffer layer 400, the high resistance buffer layer 500, and the window layer 600. The penetration hole 101 may be formed by a mechanical method.

Referring to FIG. 17, a first bus bar 711 is formed. The first bus bar 711 is connected to the window layer 600 and disposed on the inner surface of the penetration hole 101 and the bottom surface of the support substrate 100.

A portion of the first bus bar 711 is disposed on the window layer 600. That is, a portion of the first bus bar 711 makes direct contact with the window layer 600. The first bus bar 710 extends to the bottom surface and outside of the support substrate 100 through the penetration hole 101.

According to the method of the current embodiment, a solar cell apparatus having improved photoelectric conversion efficiency can be manufactured.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The solar cell apparatuses of the embodiments can be used in photovoltaic power generation fields.

The invention claimed is:

1. A solar cell apparatus comprising:
a planar substrate having a top surface;
a first solar cell having a perimeter disposed on the top surface of the substrate, wherein the first solar cell has a circular or elliptical shape; and
a second solar cell disposed on the top surface of the substrate and electrically connected to the first solar cell, wherein the second solar cell has a partially opened ring shape and the top surface of the substrate is exposed through an open region of the partially opened ring shape of the second solar cell;
a third solar cell disposed around the second solar cell, and extending directly along an outside perimeter of the second solar cell;
a first bus bar connected to the first solar cell; and
a second bus bar connected to the third solar cell;
wherein the second bus bar has a ring shape; and
wherein the second solar cell extends along the top surface of the substrate and the partially opened ring shape of the second solar cell completely surrounds the perimeter of the first solar cell except at the open region.

2. The solar cell apparatus according to claim 1, further comprising:
a bus bar connected to the first solar cell and disposed in the open region of the partially opened ring shape of the second solar cell; and
an insulation member between the bus bar and the second solar cell.

3. The solar cell apparatus according to claim 1, further comprising:
wherein the third solar cell has a partially opened ring shape, the to surface of the substrate is exposed through an open region of the partially opened ring shape of the third solar cell, and the partially opened ring shape of the third solar cell completely surrounds a perimeter of the second solar cell except at the open region; and
a bus bar connected to the third solar cell.

4. The solar cell apparatus according to claim 1, wherein the second bus bar surrounds the second solar cell.

5. The solar cell apparatus according to claim 1, further comprising a bus bar connected to the first solar cell and disposed in the open region of the partially opened ring shape of the second solar cell, through which the portion of the top surface of the substrate is exposed.

6. The solar cell apparatus according to claim 1, wherein an area of the second cell is greater than an area of the first cell.

7. A solar cell apparatus comprising:
a planar substrate having a top surface, wherein the substrate comprises a penetration hole;
a first solar cell having a perimeter disposed on the top surface of the substrate, wherein the first solar cell has a circular or elliptical shape and completely surrounds the penetration hole;
a second solar cell disposed on the to surface of the substrate and electrically connected to the first solar cell;
a connection electrode disposed in the penetration hole and connected to the first solar cell;
a bus bar connected to the connection electrode and disposed under the substrate;
wherein the second solar cell extends along the to surface of the substrate and completely surrounds the perimeter of the first solar cell, and
wherein the first solar cell and the second solar cell are concentric with one another.

8. A solar cell apparatus comprising:
a planar substrate having a top surface;
a back electrode layer disposed on the top surface of the substrate and comprising a partially opened ring shaped first groove extending completely through the back electrode layer and around a center of the planar substrate;
a light absorption layer disposed on the back electrode layer and comprising a partially opened ring shaped second groove extending completely through the light absorption layer and around the center of the planar substrate; and
a window layer disposed on the back electrode layer and comprising a partially opened ring shaped third groove extending completely through the window layer and around the center of the planar substrate, wherein the back electrode layer, the light absorption layer, and the window layer comprise an open region aligned with openings of the partially opened ring shaped grooves, and the to surface of the substrate is exposed in the open region;

a first bus bar disposed on the window layer and extending outward from the center of the substrate; and a second bus bar disposed on the window layer and extending along an outer edge of the substrate.

9. The solar apparatus according to claim 8, wherein the partially opened ring shaped first groove, the partially opened ring shaped second groove, and the partially opened ring shaped third groove are close to each other.

10. The solar cell apparatus according to claim 8, further comprising an insulation member between the window layer and the first bus bar.

11. The solar cell apparatus according to claim 8, wherein the first bus bar is disposed in the open region.

12. The solar apparatus according to claim 10, wherein the back electrode layer further comprises a partially opened ring shaped fourth groove extending around the partially opened ring shaped first groove.

13. A solar cell apparatus comprising:

a planar substrate having a top surface, wherein the substrate comprises a penetration hole;

a back electrode layer disposed on the top surface of the substrate and comprising a ring shaped first groove extending completely through the back electrode layer and completely around a center of the planar substrate;

a light absorption layer disposed on the back electrode layer and comprising a ring shaped second groove extending completely through the light absorption layer and completely around the center of the planar substrate; and a window layer disposed on the back electrode layer and comprising a ring shaped third groove extending completely through the window layer and completely around the center of the planar substrate, wherein the ring shaped first groove, ring shaped second groove and ring shaped third groove are concentric with one another;

a first bus bar connected to the back electrode layer, the first bus bar extending in the penetration hole and under the substrate; and a second bus bar disposed on the window layer and extending along an outer edge of the substrate.

14. The solar cell apparatus according to claim 13, further comprising a connection electrode disposed in the penetration hole and connected to the hack electrode layer.

* * * * *